(12) United States Patent
Vinit et al.

(10) Patent No.: US 9,759,776 B2
(45) Date of Patent: Sep. 12, 2017

(54) BATTERY CELL STATE-OF-HEALTH ESTIMATION METHOD

(71) Applicants: Commissariat à l'énergie atomique et aux énergies alternatives, Paris (FR); Decathlon, Villeveuve d'Ascq (FR)

(72) Inventors: Laurent Vinit, Le Bourget du Lac (FR); Fathia Karoui, Villeurbanne (FR)

(73) Assignees: Commissariat à l'énergie atomique et aux énergies alternatives, Paris (FR); Decathalon, Villeveuve d'ascq (FR)

( * ) Notice: Subject to any disclaimer, the term of this patent is extended or adjusted under 35 U.S.C. 154(b) by 33 days.

(21) Appl. No.: 14/658,581

(22) Filed: Mar. 16, 2015

(65) Prior Publication Data

US 2015/0260795 A1     Sep. 17, 2015

(30) Foreign Application Priority Data

Mar. 17, 2014  (FR) ...................................... 14 52182

(51) Int. Cl.
  *H02J 7/00*       (2006.01)
  *G01R 31/36*      (2006.01)

(52) U.S. Cl.
  CPC ....... *G01R 31/361* (2013.01); *G01R 31/3679* (2013.01); *G01R 31/3624* (2013.01)

(58) Field of Classification Search
  CPC ............. H02J 2007/005; G01R 31/361; G01R 31/3624; G01R 31/3679
  USPC .......................... 320/132, 134, 157; 324/426
  See application file for complete search history.

(56) References Cited

U.S. PATENT DOCUMENTS

| | | | |
|---|---|---|---|
| 2011/0307201 A1 | 12/2011 | Yang et al. | |
| 2012/0049802 A1* | 3/2012 | Barsukov | G01R 31/3651 320/136 |
| 2012/0293132 A1 | 11/2012 | Kaino et al. | |
| 2013/0090872 A1 | 4/2013 | Kurimoto | |
| 2014/0021959 A1* | 1/2014 | Maluf | G01R 31/3637 324/430 |
| 2014/0266060 A1 | 9/2014 | Ying | |

(Continued)

FOREIGN PATENT DOCUMENTS

| | | |
|---|---|---|
| EP | 1263111 A2 | 12/2002 |
| EP | 1562048 A1 | 8/2005 |
| JP | 2000261901 A | 9/2000 |

OTHER PUBLICATIONS

Istvan Jedlicska, "French Search Report", dated Dec. 19, 2014, issued in counterpart application No. FR14/52181 (counterpart to related U.S. Appl. No. 14/658,557, filed Mar. 16, 2015).

(Continued)

*Primary Examiner* — Edward Tso
*Assistant Examiner* — Aaron Piggush
(74) *Attorney, Agent, or Firm* — Kaplan Breyer Schwarz, LLP

(57) ABSTRACT

A method of determining the state of health of a first elementary cell of a battery, including the steps of: measuring the voltage across the cell under a reference current at a plurality of times in a phase of cell charge or discharge between first and second state-of-charge levels; and detecting a crossing by the voltage of a predetermined specific value, corresponding to a predetermined specific charge value of the cell.

12 Claims, 2 Drawing Sheets

(56) References Cited

U.S. PATENT DOCUMENTS

2014/0306712 A1    10/2014    Esnard-Domerego

OTHER PUBLICATIONS

Vinit et al, "Related U.S. Appl. No. 14/658,557," filed Mar. 16, 2015.
Istvan Jedlicska, "French Search Report", dated Nov. 25, 2014, issued in counterpart application No. FR14/52182.
Manuel J. Hernandez, "Non-Final Office Action", Issued in U.S. Appl. No. 14/658,557, Dated Apr. 18, 2017, 8 pp.

* cited by examiner

BATTERY CELL STATE-OF-HEALTH ESTIMATION METHOD

The present patent application claims the priority benefit of French patent application FR14/52182, the contents of which are incorporated herein by reference in its entirety to the maximum extent allowable by law.

BACKGROUND

The present disclosure generally relates to the field of electric batteries, and more particularly aims at determining the state of health or aging state of an elementary battery cell.

DISCUSSION OF THE RELATED ART

An electric battery is a group of a plurality of rechargeable elementary cells (cells, accumulators, etc.) connected in series and/or in parallel between two voltage supply nodes or terminals.

A battery is often associated with a management device connected to the battery cells, which may implement various functions such as cell balancing functions, protection functions, etc.

In certain systems, the management device manages gauges or indicators enabling it to known at any time the state of charge, SOC, of each elementary cell of the battery, that is, the ratio of the charge contained in the cell to the total capacity of the cell at the considered time. The management device may for example estimate the state of charge of each cell based on predefined algorithms and/or on measurements made by sensors connected to the battery cells.

In certain systems, the management device further manages a complementary indicator representative of the cell aging, generally called SOH, for "State of Health". At a given time of the lifetime of a cell, the SOH is equal to the ratio of the cell capacity at the considered time to the capacity of the cell when new. Knowing the SOH of each cell may for example enable to identify defective cells to isolate or replace them, or to readjust the state-of-charge gauges of the cells to take into account the state of health of the cells, to enable them to keep on providing a relatively reliable estimate.

Know cell SOH determination techniques use a measurement of the cell capacity. For this purpose, the cell may be fully discharged and then fully recharged, or fully recharged and then fully discharged. During the full recharge or full discharge phase, the charge stored in the cell or extracted from the cell may be measured by coulometric measurement, which amounts to measuring the real capacity of the cell. Knowing the real capacity of the cell, the management device can then recalculate the cell SOH by dividing this real capacity by the capacity of the cell when new or by the nominal capacity of the cell, which may be stored in the management device. A disadvantage of such SOH determination techniques is that they require implementing a full discharge of the cell followed by a full charge, or a full charge followed by a full discharge, which is relatively constraining and may be a problem in certain applications.

Document JP2000261901 describes a method of measuring the degradation of the capacity of a battery.

SUMMARY

Thus, an embodiment provides a method of determining the state of health of a first elementary cell of a battery, comprising the steps of: measuring the voltage across the cell at a plurality of times in a phase of cell charge or discharge between first and second state-of-charge levels; and detecting a crossing by the voltage of a predetermined specific value, corresponding to a predetermined specific charge value of the cell, the specific charge and voltage values corresponding to the coordinates of a crossing point of at least two curves representative of the variation of said voltage according to the charge contained in the cell, for different states of health of the cell.

According to an embodiment, the voltage is the voltage across the cell under a reference current.

According to an embodiment, the method further comprises determining and storing variations of the cell charge between the voltage measurements.

According to an embodiment, the charge variations are measured by a coulometer or a current integrator.

According to an embodiment, the charge variations are estimated by taking into account the time elapsed between voltage measurements.

According to an embodiment, the method comprises a step of determining the slope of the curve representative of the variation of the voltage according to the cell charge variation, as it crosses the specific voltage value.

According to an embodiment, the method comprises a step of calculating the average value of the voltage between first and second cell charge levels, the first and second charge levels being both higher than the specific charge value or both lower than the specific charge value.

According to an embodiment, the method further comprises, after the detection of the crossing by the voltage of the predetermined specific value, a step of full recharge of the cell, and the measurement of the charge injected into the cell during this recharge step.

According to an embodiment, the specific charge value is in the range from 20% to 60% of the nominal full charge capacity of the cell.

According to an embodiment, the cell is a cell of lithium-ion type and the specific charge value is in the range from 38% to 42% of the nominal full charge capacity of the cell.

According to an embodiment, the cell has a 2.2-Ah nominal capacity and a 4.2-V nominal full charge voltage, and the specific voltage value is in the range from 3.5 V to 3.6 V.

According to an embodiment, the method further comprises a previous characterization phase comprising acquiring, for a second elementary cell of same type as the first cell, at least two characteristic curves representative of the variation of the voltage across the second cell according to the charge contained in the second cell, for at least two different states of health of the second cell.

According to an embodiment, the previous characterization phase further comprises a step of determining a crossing point of the two characteristic curves in the charge range from 20% to 60% of the nominal cell capacity.

Another embodiment provides a system comprising: a battery comprising a plurality of elementary cells and a battery management device, wherein the management device is capable of determining the state of health of an elementary cell by a method of the above-mentioned type.

According to an embodiment, the battery is a battery having a dynamically reconfigurable architecture, and the management device is capable of dynamically disconnecting and connecting back battery cells so that an AC voltage is provided across the battery.

According to an embodiment, the reference current is zero, and the steps of measuring the voltage across the first cell are implemented during periods of disconnection of the first cell by the management device to generate an AC voltage across the battery.

The foregoing and other features and advantages will be discussed in detail in the following non-limiting description of specific embodiments in connection with the accompanying drawings.

DETAILED DESCRIPTION

Figure 1:
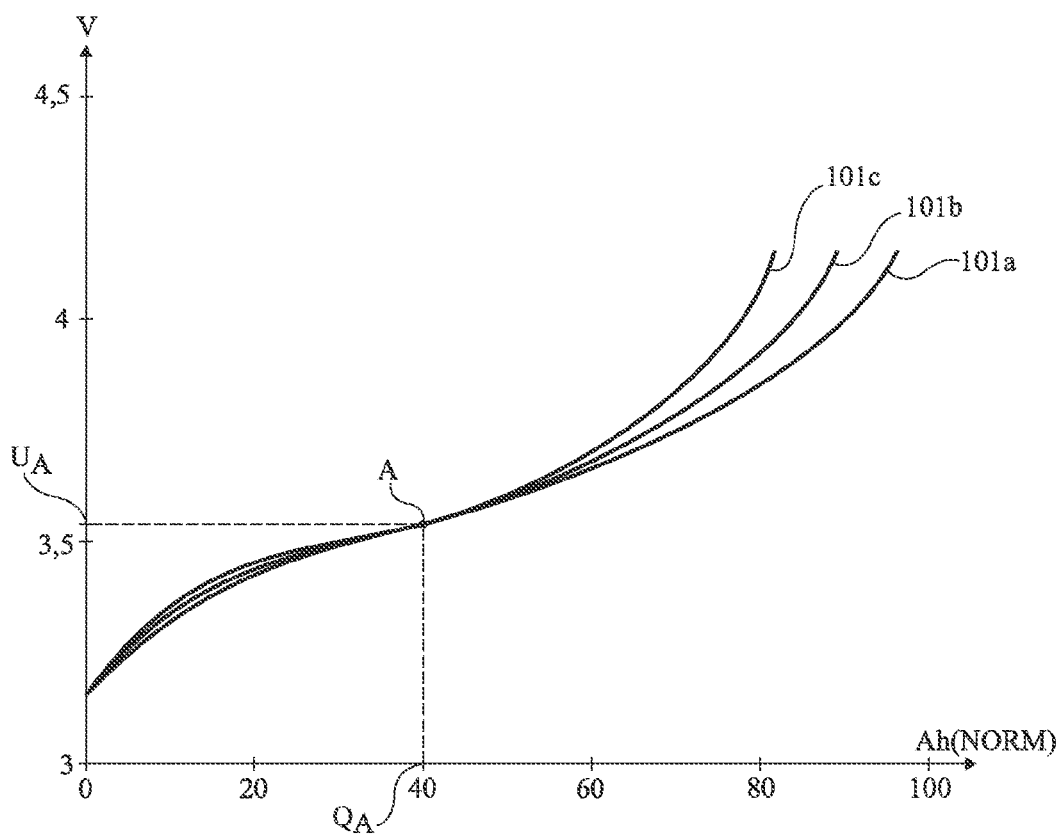
FIG. 1 is a diagram illustrating the variation as it ages of the behavior of an elementary battery cell.

FIG. 1 is a diagram comprising three curves 101a, 101b, and 101c showing, for three different aging states or states of health of a battery cell, the variation of the voltage in volts (V) across the cell under a reference current $i_{ref}$ (that is, the voltage across the cell when the cell conducts current $i_{ref}$), according to the charge contained in the cell. The curves of FIG. 1 have been drawn for a lithium-ion cell of NMC (nickel cobalt manganese)/graphite type, having a 2.2-Ah nominal capacity (that is the capacity displayed by the manufacturer), and a 4.2-V nominal full charge voltage. Curve 101a shows the behavior of the cell when new, curve 101b corresponds to the same cell after approximately 600 charge/discharge cycles representative of a typical use of the cell, and curve 101c corresponds to the same cell after approximately 1,200 discharge/charge cycles representative of a typical use of the cell. In this example, the voltage measurements have been made under a zero reference current $i_{ref}$. Further, in FIG. 1, the cell charge, in abscissa, has been represented in normalized remaining amperes-hour (Ah NORM), that is, as a percentage of the nominal cell capacity. It thus really is a variable representative of the physical charge effectively contained in the cell (or number of remaining Ah), and not of the cell state of charge (SOC), which is a percentage of the real total capacity of the cell which may vary as the cell ages.

Tests carried out by the inventors have shown that the curves characteristic of the voltage across the cell, under a constant reference current, according to the cell charge, at the different cell states of health, are all monotonous (that is, continuously increasing or decreasing) in the cell operating range, and all cross at a same point characteristic of the cell, here designated with reference A. In the specific example of FIG. 1, point A corresponds to a 3.55-V voltage $U_A$ and a charge $Q_A$ of 40% of the nominal capacity of the cell (that is, 0.88 Ah in this example).

Tests carried out by the inventors have further shown that a similar behavior can be observed when the voltage measurements are made under a non-zero reference current $i_{ref}$, for example, a negative current—that is, a cell discharge current—or a positive current—that is, a cell charge current. In this case, coordinates $U_A$ and $Q_A$ of point A may change with respect to the example of FIG. 1, but the same phenomenon as in the example of FIG. 1 occurs, that is, all the characteristic voltage/charge curves at different cell states of health cross at a same point A.

The inventors have further observed that this same phenomenon can be observed for other types of cells than the lithium-ion cells of the example of FIG. 1, for example, lithium-ion cells having a nominal capacity different from 2.2 Ah and/or a nominal full charge voltage different from 4.2 V, or cells having a different chemistry, provided for these cells to have monotonous voltage/charge characteristics (with no plateau), for example lithium-ion cells of LMO (LiMn$_2$O$_4$)/graphite type. The position of point A then depends on the cell characteristics and on the considered reference current $i_{ref}$, and is typically in the charge level range from 20% to 60% of the nominal capacity of the cell.

For a given cell type, a characterization phase may be implemented, which enables to determine the position of point A for a reference current $i_{ref}$ which is selected, for example, $i_{ref}=0$ A. A non-limiting example of a cell type characterization method will now be described.

To begin with, a cell of the type to be characterized, having a first state of health, may be fully discharged. This cell may then be fully recharged by periodically measuring the cell voltage under current $i_{ref}$ during the charge. The real physical charge contained in the cell may be measured during the charge phase, for example, by means of a coulometer or of a current integrator. A measured value of the charge contained in the cell can thus be matched to each measured voltage value to obtain a characteristic remaining voltage/charge curve of the type shown in FIG. 1. It should be noted that if the charge current is different from $i_{ref}$ (particularly in the case where $i_{ref}=0$), the current flowing through the cell may be periodically forced to value $i_{ref}$ for a short time period, for example, shorter than 1 ms, and preferably shorter than 10 is, corresponding to the time necessary to measure the voltage across the cell. As a variation, the characteristic voltage/charge curve may be acquired during a phase of full discharge of the cell, rather than during a charge phase.

The cell can then be "aged" by being submitted to charge/discharge cycles representative of a typical use of the cell.

The above-mentioned steps may be repeated at least once to obtain at least a second characteristic voltage/charge curve of the type shown in FIG. 1, for at least one second cell state of health.

When at least two characteristic charge/voltage curves corresponding to different states of health of the cell have been recorded, point A may be determined based on these two curves, for example, by searching for the crossing point between two characteristic curves in the charge range from 20% to 60% of the nominal cell capacity.

The measurements of the voltage according to the charge made during the characterization phase may be optionally smoothed before determining point A. As a non-limiting numerical example, points of the characteristic voltage/charge curves may be acquired at a 100-kHz frequency (one point every 10 μs), and then averaged over a sliding window of 2,000 points (20 ms).

Once the coordinates of point A are known for a cell type and a reference current $i_{ref}$, they may be stored by a device for managing a battery comprising elementary cells of this type.

The detection by the management device of the crossing by the battery cell of point A when the battery is in operation enables the management device to reliably know the charge available in this cell, independently from possible drifts of the battery gauges due to cell aging or to other phenomena.

The battery management device is for example capable of implementing, for each battery cell, a method of detecting a crossing of point A comprising the steps of:

measuring the voltage across the cell under reference current $i_{ref}$ at a plurality of times in a phase of cell charge or discharge between first and second state-of-charge levels of the cell, for example, between 20% and 80% of the cell SOC; and detecting a specific predefined value $U_A$ of this voltage, stored in the management device, this voltage corresponding to the voltage coordinate of point A predetermined during the characterization phase.

The charge or discharge phase of the method of detecting point A may correspond to a charge or a discharge of the cell by normal use of the battery by a system comprising the battery, for example, a power-assisted vehicle. If the normal cell charge or discharge current is different from reference current $i_{ref}$, the management device may periodically force the current crossing the cell to value $i_{ref}$ for a time period preferably sufficiently short to avoid disturbing the system operation, for example, for a time period shorter than 1 ms and preferably shorter than 10 corresponding to the time necessary to measure the voltage across the cell. This time period is preferably selected to be possibly identical or similar, for example equal to within 20%, to the time period for which the current is periodically forced to value $i_{ref}$ during the characterization phase to acquire characteristic curves of the cell. As a variation, the method of detecting point A may correspond to a dedicated cell charge or discharge phase, which may be implemented by the battery management device specifically to make the cell cross point A and thus enable to detect the crossing of point A.

The above-mentioned method of detecting the crossing of point A by a battery cell may for example be used by the management device to readjust a state-of-charge gauge of the cell. The battery management device may for example implement a method of assessing the state of charge of a battery cell, this method comprising phases of estimating the state of charge of the cell and, between estimation phases, phases of readjusting the estimation method enabling to compensate for possible drifts, for example, drifts due to the cell aging or drifts of the measurements made by sensors of the management system, such readjustment phases being capable of comprising phases of detection of the crossing of point A of the cell. As an example, a state-of-charge gauge of the cell may be readjusted after a phase of detection of a crossing of point A of the cell, to compensate for a possible difference between an estimated charge value of the cell and the real charge value known at point A, at the time of detection of point A. An advantage is that the readjustment of a state-of-charge gauge of the cell by detection of a crossing of point A by the cell does not require a full discharge or a full charge of the cell. This enables to make the readjustment phases much less constraining than with known state-of-charge readjustment solutions. More frequent readjustments than in existing system may particularly be provided. This may for example enable to use state-of-charge estimation algorithms simpler than in existing systems, since a possible decrease of the reliability of the estimation algorithms may be compensated by more frequent readjustments.

According to an aspect of the described embodiments, a detection by the management device of the crossing by a battery cell of point A may be used to determine the state of health or SOH of the cell.

An example of a method of determining the SOH of a battery cell capable of being implemented by a battery management device will now be described.

This method comprises a phase of measuring the voltage across the cell under reference current $i_{ref}$ at a plurality of times in a phase of cell charge or discharge between first and second cell charge levels. The first and second charge levels are such that the range from the first to the second charge level comprises charge level $Q_A$ of point A of the cell. As an example, the voltage measurements are made across a charge level range from 20% to 60% of the nominal capacity of the cell, or across a state-of-charge range (SOC) from 20% to 80%.

The charge or discharge phase of the method of determining the SOH may correspond to a charge or a discharge of the cell by normal use of the battery by a system comprising the battery. If the normal charge or discharge current of the cell is different from reference current $i_{ref}$, the management device may periodically force the current flowing through the cell to value $i_{ref}$ for a time period preferably sufficiently short to avoid disturbing the user, for example, for a time period shorter than 1 ms and preferably shorter than 10 µs, corresponding to the time necessary to measure the voltage across the cell. This time period is preferably selected to be possibly identical or similar, for example equal to within 20%, to the time period for which the current is periodically forced to value $i_{ref}$ during the characterization phase. As a variation, the SOH determination method may comprise a dedicated cell charge or discharge phase, which may be implemented by the battery management device specifically to determine the cell SOH.

In this example, during the SOH determination method, the management device measures the charge stored in the cell or extracted from the cell between the different voltage measurements, for example, by means of a coulometer or of a current integrator. It should be noted that if the cell charge or discharge mode during the SOH determination method is considered as steady and known, the charge variation in the cell between two voltage measurements is proportional to the time elapsed between the two measurements. The management circuit can then estimate the charge variations by simply knowing the time elapsed between the voltage measurements, which may for example be measured by means of a clock. An advantage is that the cell SOH can then be determined with no current measurement.

The voltage values measured under current $i_{ref}$, as well as the charge variations of the cell between the different voltage measurements, may be stored, for example, in a memory of the management device.

The method of determining the cell SOH further comprises a step of detecting the crossing, by the voltage across the cell under reference current $i_{ref}$, of specific voltage value $U_A$ of point A.

According to a first embodiment, once the crossing by the cell of voltage $U_A$ has been detected, the SOH may be estimated by the battery management device by calculating a variable representative of the slope, at voltage point $U_A$, of the characteristic curve of the voltage under current $i_{ref}$ according to the charge variations of the cell. As an example, this variable may be the slope of the linear interpolation of the characteristic at voltage point $U_A$, the slope of the derivative of the characteristic at voltage point $U_A$, the angle of the direction vector of the linear interpolation of the characteristic at voltage point $U_A$, etc.

The inventors have indeed observed (as shown in FIG. 1) that the slope, at voltage point $U_A$, of the curve representative of the cell voltage under current $i_{ref}$ according to the cell charge variation varies substantially monotonously along with the cell SOH. In particular, in the case of lithium-ion cells, the inventors have observed that the slope, at voltage point $U_A$, of the curve representative of the cell voltage under current $i_{ref}$ according to the cell charge variation varies substantially linearly along with the cell SOH.

Figure 2:
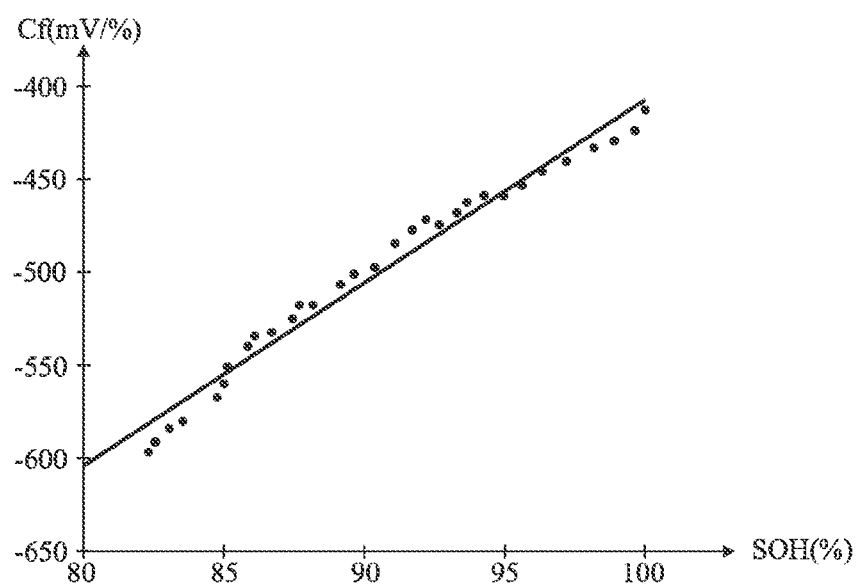
FIG. 2 is a diagram illustrating the variation of a characteristic value of an elementary battery cell as it ages.

This linearity phenomenon is illustrated by FIG. 2 showing the variation of the slope, in mV/% (in ordinates), at voltage point $U_A$, of the curve representative of the voltage in the cell under current $i_{ref}$ according to the cell charge variation, according to the cell SOH, in % (in abscissas).

For a given cell type, a characterization phase may be implemented, which enables to determine a law of variation for the cell SOH according to the slope, at voltage point $U_A$, of the curve representative of the cell voltage under current $i_{ref}$ according to the charge variation of the cell. To achieve this, a characteristic slope may be measured for a plurality of different SOHs of a same cell which is intentionally aged in a laboratory for the characterization. As an example, the characterization may be performed at the same time as a characterization phase carried out to determine the position of point A for cells of the considered type.

The battery management device may comprise a conversion circuit enabling to provide an estimate of the cell SOH according to the variable representative of the slope, at voltage point $U_A$, of the characteristic curve of the cell voltage under current $i_{ref}$ according to the cell charge variations. As a non-limiting example, the conversion circuit may comprise a look-up table comprising characteristic slope values determined for different SOHs during the characterization and calculation means enabling to interpolate the SOH for the slope values which are not in the look-up table. As a variation, if an analytic expression approximating the law of variation of the characteristic slope according to the cell SOH has been determined during the characterization, this expression may be used by the conversion circuit to estimate the cell SOH.

According to a second embodiment, once the crossing of voltage $U_A$ by the cell has been detected, the SOH may be estimated by the battery management device by calculating a variable representative of the average of the measured voltage values of the cell under current $i_{ref}$ (preferably over a relatively large number of points to do away with possible parasitic variations of the measured values), within a range of cell charge levels excluding point A, and preferably within a range of charge levels higher than point A, for example within the range from level $Q_A$+10% of the nominal cell capacity to level $Q_A$+20% of the nominal cell capacity (that is, within the range from 50% to 60% of the nominal cell capacity in the example of FIG. 1).

The inventors have indeed observed that the average, in a range of charge levels excluding point A, of the voltage across the cell under current $i_{ref}$, varies substantially monotonously along with the cell SOH. In particular, in a range of charge levels higher than point A, the average of the voltage across the cell under current $i_{ref}$ is all the higher as the cell SOH is low (that is, as the cell aging is significant).

For a given cell type, a characterization phase may be implemented, which enables to determine a law of variation of the SOH of a cell according to the average of the cell voltage under current $i_{ref}$, within a range of charge levels which will be selected and which does not comprise level $Q_A$. To achieve this, this characteristic average may be measured for a plurality of different SOHs of a same cell, which is intentionally aged in a laboratory for the characterization. As an example, the characterization may be performed at the same time as a characterization phase carried out to determine the position of point A for cells of the considered type.

The battery management device may comprise a conversion circuit enabling to provide an estimate of the cell SOH according to the average of the cell voltage under current $i_{ref}$, within the selected range of reference charge levels. As a non-limiting example, the conversion circuit may comprise a look-up table comprising characteristic average voltage values in the range of reference charge levels, and calculation means enabling to interpolate the SOH for the average voltage values which are absent from the look-up table. As a variation, if an analytic expression approximating the law of variation of the cell SOH according to the average cell voltage under current $i_{ref}$ in the selected reference range has been determined during the characterization, this expression may be used by the conversion circuit to estimate the cell SOH.

According to a third embodiment, once the crossing by the cell of voltage $U_A$ has been detected, the cell may be fully charged. During this charge phase, charge quantity Q1 stored in the cell may be measured, for example, by means of a coulometer, or estimated, for example by means of a time measurement if the charge mode is known. When the full charge of the cell is reached, the total capacity of cell $Q_{Ti}$ may be calculated by formula $Q_{Ti}=Q_A+Q1$, which enables to calculate the cell SOH.

In practice, so that the SOH measurement is transparent for the user in the case where a crossing by the cell of voltage $U_A$ is detected during a cell discharge phase, it may be provided, once the crossing by the cell of voltage $U_A$ has been detected, to let the user keep on discharging the cell while measuring or estimating the quantity of charge Q2 delivered from the crossing of point A. Once the user has finished using the battery, it may be provided to fully recharge the battery. During the recharge phase, the quantity of charge Q3 stored in the cell may be measured or estimated. When the full charge of the cell is reached, the total capacity of cell $Q_{Ti}$ may be calculated by formula $Q_{Ti}=Q_A-Q2+Q3$, which enables to calculate the cell SOH.

An advantage of this third embodiment is that it enables to determine the SOH of cell without having to fully discharge this cell, and without using embarked tables of characteristic curves and/or values.

An advantage of methods of determining the SOH of a cell of the type described in the present application is that the SOH can be determined without having to fully charge or discharge the cell. This enables to make the SOH determination less constraining than with known solutions. SOH determination phases more frequent than in existing system may particularly be provided, which for example enables to increase the reliability of the state-of-charge gauges of the cells.

The embodiments described in the present application of a method of detecting the crossing of point A by a cell, or of readjusting a state-of-charge gauge of a cell, or of determining the SOH of a cell, although not limited to this specific case, are particularly advantageous for a use in a battery having a dynamically reconfigurable electric architecture. Battery having a dynamically reconfigurable electric architecture here means a battery where the diagram of interconnection of the elementary battery cells between the battery voltage supply terminals can be dynamically modified during the battery operation, so that an AC voltage is provided across the battery, for example to power an electric motor or any other load capable of being powered by an AC voltage. Embodiments of batteries with a dynamically reconfigurable electric architecture are for example described in patent applications FR2972304, FR2972305, FR2972306, and FR2972308 of the applicant.

A battery with a dynamically reconfigurable electric architecture typically comprises a management device capable of dynamically disconnecting and connecting back battery cells, possibly by modifying their position and/or their connection mode (series or parallel) with respect to the other battery cells, at a relatively high frequency, during battery operation phases.

Each time a cell is disconnected, the current flowing through this cell becomes zero during the disconnection period, for example, in the range from 1 µs to 1 ms. Advantageously, the battery management device may exploit such frequent disconnections to implement a method of the above-mentioned type for a zero reference current $i_{ref}$. To achieve this, the management system may measure the cell voltage during periods of cell disconnection belonging to the normal operation of the system, for example to detect a crossing by the cell of voltage $U_A$ of point A, and/or to determine the cell SOH by the above-described methods. An advantage is that voltage measurements under current $i_{ref}$ then require no disturbance of the normal operating mode of the battery.

Figure 3:
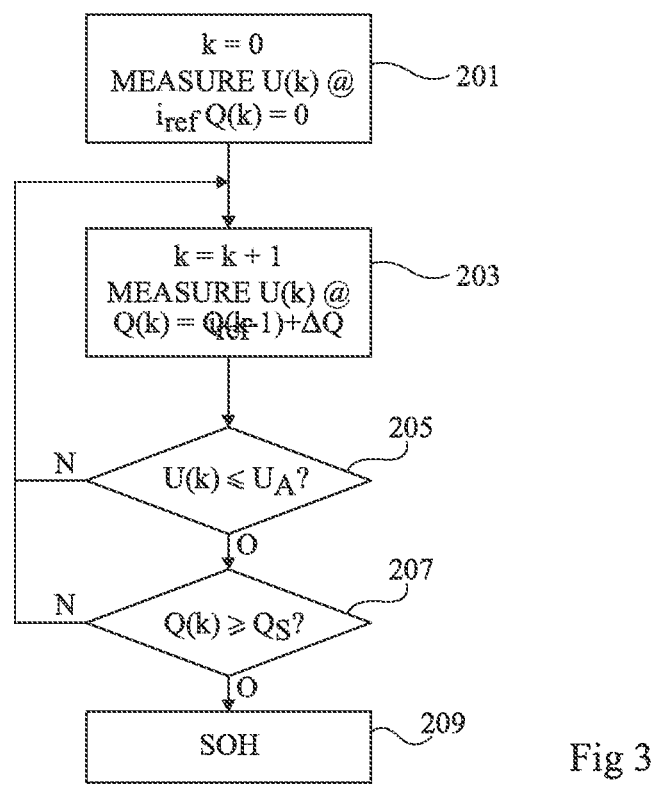
FIG. 3 illustrates in the form of blocks an embodiment of a method of determining the state of health of an elementary battery cell.

FIG. 3 illustrates in the form of blocks a non-limiting embodiment of a method of determining the SOH of a battery cell, which may be implemented during a cell discharge phase. It should be noted that based on the following description, it will be within the abilities of those skilled in the art to adapt the method of FIG. 3 to determine the SOH during a cell charge phase.

The method of FIG. 3 may be started by the battery management device during a cell discharge phase, before the cell charge level reaches value $Q_A$. As a non-limiting example, the method of FIG. 3 is triggered when the state of charge of the cell reaches a threshold in the range from 60% to 80% of the SOC.

The method of FIG. 3 comprises an initial step 201 during which the voltage across the cell is measured under current $i_{ref}$, and the measured voltage value is written in a field U(0), of rank k=0, of a table U for storing the measured voltage values. At step 201, a field Q(0), of rank k=0, of a table Q for storing values of the charge quantity extracted from the cell, is set to value 0.

At a step 203 subsequent to step 201, index k for pointing into tables U and Q is incremented by 1, and the voltage across the cell is measured again under current $i_{ref}$. The measured voltage value is written into field U(k) of table U. Further, at step 203, charge variation ΔQ of the cell between the step of measuring voltage U(k−1) and the step of measuring voltage U(k) is determined, for example, by coulometric measurement, or estimated from the time elapsed between two measurements. Value Q(k−1)+ΔQ is written into field Q(k) of table Q.

At a step 205, the management device verifies whether voltage U(k) measured at step 203 has crossed voltage value $U_A$ of characteristic point A of the cell. If, at step 205, value U(k) is greater than value $U_A$, steps 203 and 205 are repeated.

If, at step 205, value U(k) is smaller than or equal to value $U_A$, a step 207 is implemented, during which the management device verifies whether charge variation Q(k) of the cell from the beginning of the process has reached a threshold $Q_S$. If, at step 205, value Q(k) is smaller than threshold $Q_S$, steps 203, 205, and 207 are repeated. If, at step 207, value Q(k) is greater than or equal to value $Q_S$, a step 209 of determining the SOH of the cell is implemented.

At step 209, the SOH may for example be determined from the values contained in tables U and Q, according to one of the above-mentioned methods, that is, by calculation of a variable representative of the slope, at voltage point $U_A$, of the characteristic curve of the cell voltage under current $i_{ref}$ according to the cell charge variations, or by calculation of a variable representative of the average of the cell voltage under current $i_{ref}$ within a range of cell charge levels higher than point A or lower than point A. At the end of step 209, the SOH determination method ends.

Specific embodiments have been described. Various alterations, modifications, and improvements will readily occur to those skilled in the art.

In particular, the battery management device may optionally store, in addition to the coordinates of point A, all of one or a plurality of the characteristic voltage/charge curves of the cells at a reference current $i_{ref}$, determined during a cell characterization phase. In this case, to assess the state of charge of a battery cell, the management device may measure the voltage across the cell under current $i_{ref}$, and estimate the state of charge of the cell based on this measurement and on the stored characteristic curves. The specific curve used to estimate the state of charge of a cell may be selected by taking into account an indicator of the cell SOH.

Further, during the cell characterization phase, the coordinates of point A, as well as the characteristic slopes of the voltage/charge curves at point A, and/or the characteristic averages of the voltage in a range of charge levels excluding point A, may optionally be determined for a plurality of different reference currents $i_{ref}$. In this case, when the management device implements a phase of SOH determination by a method of the above-mentioned type, it may select the reference current best adapted to what use is made of the battery during the SOH determination phase.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method of determining the state of health of a first elementary cell of a battery, comprising the steps of:
   measuring, with a sensor of a management device of the battery, the voltage across the cell at a plurality of times in a phase of cell charge between first and second state-of-charge levels or a plurality of times in a phase of cell discharge between first and second state-of-charge levels;
   measuring, with a coulometer or a current integrator of the management device of the battery, variations of cell charge of the cell between said voltage measurements;
   detecting, with the management device of the battery, a crossing by said voltage of a predetermined specific value, corresponding to a predetermined specific physical charge value of the cell, said specific physical charge value and said specific voltage values corresponding to the coordinates of a crossing point of at least two curves representative of the variation of said voltage according to the charge contained in the cell, said at least two curves corresponding respectively to different states of health of the cell;
   calculating, with the management device, a variable representing:
      a slope of a curve representing the variation of said voltage according to the charge variation of the cell, at the crossing of said specific voltage value; or
      an average value of said voltage between first and second cell charge levels, said first and second cell charge levels both being higher than said specific charge value or lower than said specific charge value; and converting, with the management device, said variable into a state of health value.

2. The method of claim 1, wherein said voltage is the voltage across the cell under a reference current.

3. The method of claim 2, wherein said reference current is zero and wherein said steps of measuring the voltage across the first cell are implemented during periods of disconnection of the first cell by the management device for the generation of an AC voltage across the battery.

4. The method of claim 1, further comprising storing the variations of the cell charge between said voltage measurements.

5. The method of claim 1, wherein said specific charge value is in the range from 20% to 60% of the nominal full charge capacity of the cell.

6. The method of claim 1, wherein said cell is a cell of lithium-ion type and wherein said specific charge value is in the range from 38% to 42% of the nominal full charge capacity of the cell.

7. The method of claim 6, wherein said cell has a 2.2-Ah nominal capacity and a 4.2-V nominal full charge voltage, and wherein said specific voltage value is in the range from 3.5 V to 3.6 V.

8. The method of claim 1, further comprising a previous characterization phase comprising acquiring, for a second elementary cell of the same type as the first cell, at least two characteristic curves representative of the variation of the voltage across the second cell according to the charge contained in the second cell, for at least two different states of health of the second cell.

9. The method of claim 8, wherein the previous characterization phase further comprises a step of determining a crossing point of said at least two characteristic curves in the charge range from 20% to 60% of the nominal capacity of the cell.

10. A system comprising:
a battery comprising a plurality of elementary cells; and
a battery management device comprising a sensor and one of a coulometer and a current integrator;
wherein the management device determines the state of health of an elementary cell by:
measuring, with the sensor, the voltage across the cell at a plurality of times in a phase of cell charge between first and second state-of-charge levels or a plurality of times in a phase of cell discharge between first and second state-of-charge levels;
measuring, with the coulometer or the current integrator, variations of cell charge of the cell between said voltage measurements;
detecting a crossing by said voltage of a predetermined specific value, corresponding to a predetermined specific physical charge value of the cell, said specific physical charge value and said specific voltage value corresponding to the coordinates of a crossing point of at least two curves representative of the variation of said voltage according to the charge contained in the cell, said at least two curves corresponding respectively to different states of health of the cell;
calculating a variable representing:
a slope of a curve representing the variation of said voltage according to the charge variation of the cell, at the crossing of said specific voltage value; or
an average value of said voltage between first and second cell charge levels, said first and second cell charge levels both being higher than said specific charge value or lower than said specific charge value;
and
converting said variable into a state of health value.

11. The system of claim 10, wherein the battery is a battery with a dynamically reconfigurable architecture, and wherein the management device is capable of dynamically disconnecting and connecting back cells of the battery so that an AC voltage is provided across the battery.

12. The system of claim 11, wherein said reference current is zero and wherein said steps of measuring the voltage across the first cell are implemented during periods of disconnection of the first cell by the management device for the generation of an AC voltage across the battery.

* * * * *